United States Patent
Marcinkiewicz

[11] Patent Number: 6,025,995
[45] Date of Patent: Feb. 15, 2000

[54] INTEGRATED CIRCUIT MODULE AND METHOD

[75] Inventor: Walter M. Marcinkiewicz, Apex, N.C.

[73] Assignee: Ericsson Inc., Research Triangle Park, N.C.

[21] Appl. No.: 08/964,645

[22] Filed: Nov. 5, 1997

[51] Int. Cl.[7] .................................................. H05K 7/02
[52] U.S. Cl. ...................... 361/760; 361/761; 361/764; 361/704; 361/762; 361/771; 361/783; 257/700; 257/795; 257/774; 257/782; 257/783
[58] Field of Search ................................ 361/760, 761, 361/764, 704, 762, 771, 783, 729; 257/691, 666, 700, 723, 795, 792, 774, 782, 783

[56] References Cited

U.S. PATENT DOCUMENTS

| | | | |
|---|---|---|---|
| 4,996,097 | 2/1991 | Fischer | 428/220 |
| 5,019,535 | 5/1991 | Wojnarowski et al. | |
| 5,151,776 | 9/1992 | Wojnarowski et al. | |
| 5,157,589 | 10/1992 | Cole, Jr. et al. | 361/795 |
| 5,353,498 | 10/1994 | Fillion et al. | |
| 5,401,687 | 3/1995 | Cole et al. | |
| 5,497,033 | 3/1996 | Fillion et al. | 257/723 |
| 5,527,741 | 6/1996 | Cole et al. | 438/107 |
| 5,811,879 | 9/1998 | Akram | 257/723 |
| 5,841,193 | 11/1998 | Eichelberger | 257/723 |
| 5,866,952 | 2/1999 | Wojnarowski et al. | 257/788 |

*Primary Examiner*—Leo P. Picard
*Assistant Examiner*—David Foster
*Attorney, Agent, or Firm*—Wood, Phillips, VanSanten, Clark & Mortimer

[57] ABSTRACT

An integrated circuit module is provided having a substrate, an integrated circuit on the substrate and defining an active surface remote from the substrate, and a die attached to the active surface of the integrated circuit. A layer of non-conductive material conformally coats the die and active surface of the integrated circuit, with the layer of non-conductive material having a substantially level top surface. A plurality of vias are formed in the layer of non-conductive material aligned with the die and integrated circuit, respectively. A pattern of metallization is disposed on the top surface of the layer of non-conductive material extending through the plurality of vias and selectively interconnecting the die to the integrated circuit.

23 Claims, 3 Drawing Sheets

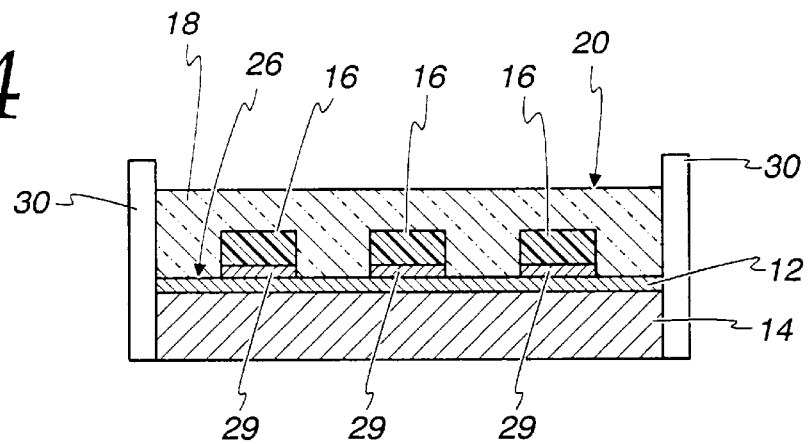
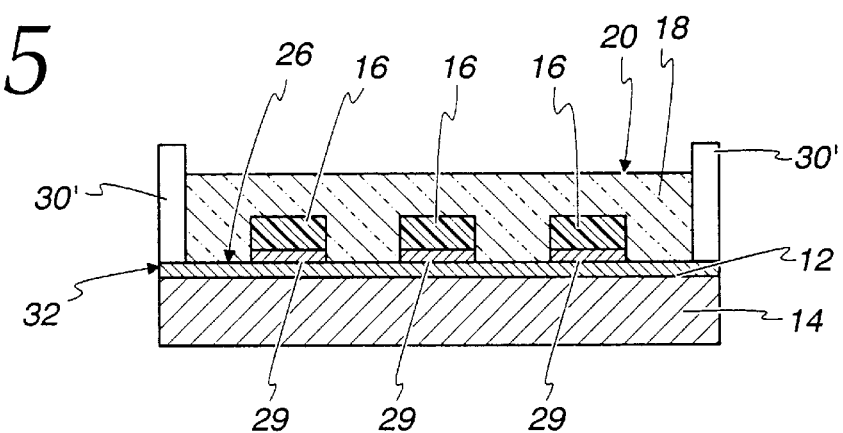
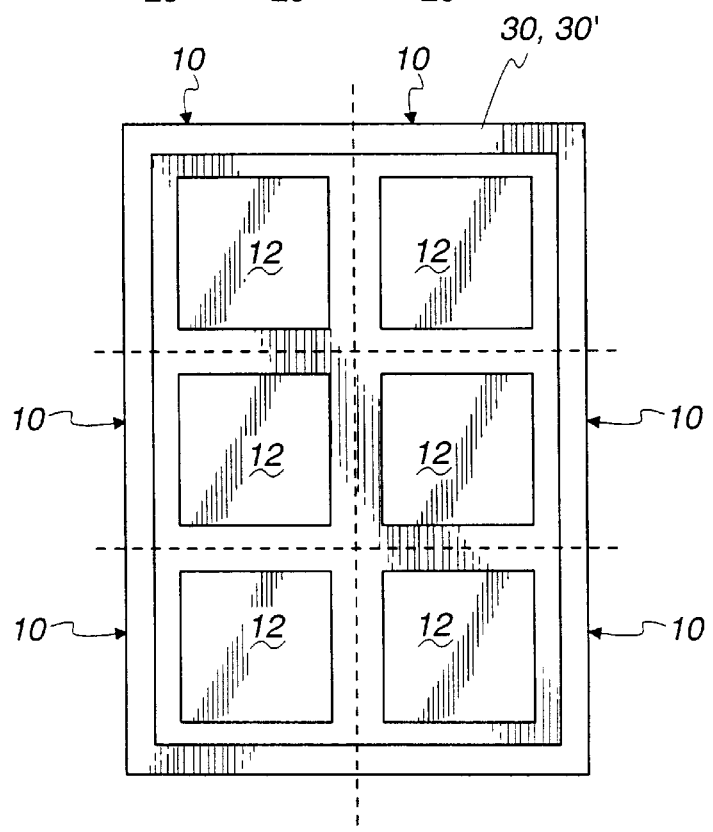

INTEGRATED CIRCUIT MODULE AND METHOD

FIELD OF THE INVENTION

The present invention is directed toward an integrated circuit module and, more particularly, toward an integrated circuit module for use in high density interconnection assemblies.

BACKGROUND OF THE INVENTION

In the fabrication of integrated circuit devices, the trend has generally been toward reducing packaging size. As a result, various high density interconnection ("HDI") techniques have been developed. One such conventional fabrication process is to place integrated circuit chips, or dies, in cavities formed in a substrate base so that the top surfaces of the chips are essentially planar with the surface of the substrate. The cavities are generally formed in the substrate utilizing a conventional milling process. After the chips are placed in the cavities, a film sheet of dielectric laminate is layered over the chips and the dielectric layer is then etched with a pattern of metallization to selectively interconnect the chips. Such a process requires precise tolerances in the milling of the cavities, and problems may arise if the chips are of varying or non-uniform thickness.

Another conventional fabrication process utilizes a flip chip attachment for affixing an integrated circuit chip to the substrate. In the flip chip method, the integrated circuit chip is patterned with various connection points which are to make contact with selected points on an integrated circuit formed on a substrate. The integrated circuit chip must then be placed precisely in a select location on the integrated circuit formed on the substrate. The flip chip attachment requires additional silicon processing steps and makes testing of components very difficult, which in turn limits the number of vendors and availability of chips used for this application. Further, the flip chip attachment may encounter problems when encapsulating the chip with a CTE mismatched material to silicon.

Still another conventional fabrication process involves attaching the integrated circuit chip to an integrated circuit formed on a substrate with a non-conductive adhesive and physically wirebonding the integrated circuit chip to select points on the integrated circuit formed on the substrate. The wirebonding method includes physically attaching the various connection wires projecting from the integrated circuit chip to various points on the integrated circuit formed on the substrate. Since integrated circuits generally place components as close as possible in order to minimize size, such physical attachment may prove difficult, cumbersome, and increase the bulkiness of the integrated circuit device.

The present invention is directed toward overcoming one or more of the above-mentioned problems.

SUMMARY OF THE INVENTION

An integrated circuit module is provided having a substrate, an integrated circuit on the substrate and defining an active surface remote from the substrate, and a die attached to the active surface of the integrated circuit. A layer of non-conductive material conformally coats the die and active surface of the integrated circuit, with the layer of non-conductive material having a substantially level top surface. A plurality of vias are formed in the layer of non-conductive material selectively aligned with the die and integrated circuit, respectively. A pattern of metallization is disposed on the top surface of the layer of non-conductive material extending through the plurality of vias and selectively interconnecting the die to the integrated circuit.

In another aspect of the present invention, the layer of non-conductive material includes a dielectric filler material suitable for microelectronic purposes.

In another aspect of the present invention, the dielectric filler material is selected from the group consisting of thermosets, thermoplastics, Plaskon, epoxies, polyimides, polyesters and Teflons.

In another aspect of the present invention, the substrate includes a non-conductive material and the integrated circuit is integrally formed on the substrate.

In another aspect of the present invention, the substrate is selected from the group consisting of ceramic, silicon, plastic and metal.

In another aspect of the present invention, the die is adhesively attached to the active surface of the integrated circuit with a non-conductive adhesive.

In another aspect of the present invention, the die is adhesively attached to the active surface of the integrated circuit at a predetermined location with a conductive adhesive.

In still another aspect of the present invention, the integrated circuit includes an integrated circuit chip having an active surface and a mounting surface opposite the active surface, with the mounting surface adhesively attached to the substrate with a non-conductive adhesive.

In yet another aspect of the present invention, a second layer of non-conductive material conformally coats the layer of non-conductive material, the plurality of vias and the pattern of metallization, with the second layer of non-conductive material having a substantially level top surface. A second plurality of vias is formed in the second layer of non-conductive material selectively aligned with the die and integrated circuit, respectively. A second pattern of metallization is disposed on the top surface of the second layer of non-conductive material, extending through the second plurality of vias and selectively interconnecting the die to the integrated circuit.

A method of fabricating an integrated circuit module is provided, the method including the steps of providing an integrated circuit on a substrate, the integrated circuit having an active surface remote from the substrate, attaching at least one die to the active surface of the integrated circuit, conformally coating at least one die and integrated with a layer of non-conductive material, the layer of non-conductive material having a substantially level top surface, providing a plurality of vias in the layer of non-conductive material selectively aligned with the at least one die and the integrated circuit, respectively, and providing a pattern of metallization on the top surface of the layer of non-conductive material extending through the plurality of vias and selectively interconnecting the at least one die to the integrated circuit.

It is an object of the present invention to provide an HDI integrated circuit module with minimum added parasitics.

It is a further object of the present invention to provide an HDI integrated circuit module without milling of pockets.

It is yet a further object of the present invention to provide an HDI integrated circuit module having maximum size shrinkage.

Other aspects, objects and advantages of the present invention can be obtained from a study of the application, the drawings, and the appended claims.

BRIEF DESCRIPTION OF THE DRAWINGS

FIG. 4 is a sectional side view similar to that of FIG. 3, further including a mold form around the integrated circuit and substrate, the mold form containing a non-conductive material conformally coating the dies and integrated circuit;

FIG. 5 is a sectional side view similar to that of FIG. 4, depicting the mold form around only the integrated circuit;

FIG. 6 is a top plan view depicting various integrated circuits formed on a substrate during manufacturing integrated circuit modules of the present invention;

DETAILED DESCRIPTION OF THE PREFERRED EMBODIMENT

Figure 1:
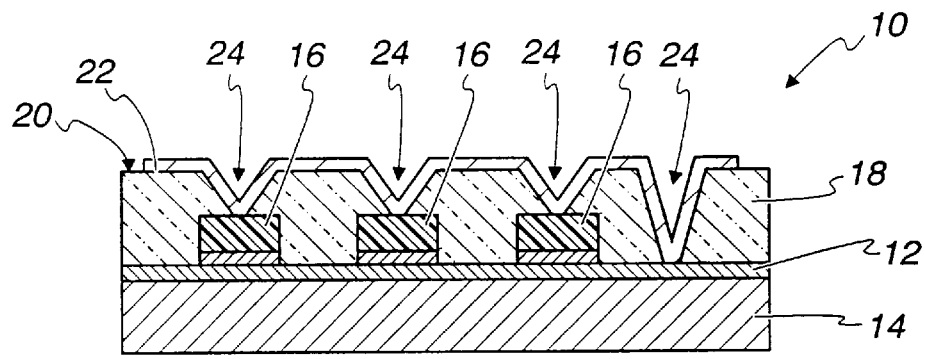
FIG. 1 is a sectional view of an integrated circuit module according to the present invention.

An integrated circuit module according to the present invention is shown generally at 10 in FIG. 1. The integrated circuit module 10 includes an integrated circuit 12 formed on a substrate or base 14. A plurality of dies 16 are provided on the integrated circuit 12. A dielectric filler material 18 conformally coats the dies 16 and integrated circuit 12, the dielectric filler material 18 having a substantially level top surface 20. A pattern of metallization 22 is provided on the top surface 20 of the dielectric filler material 18 and extends into vias 24 formed in the dielectric filler material 18 interconnecting the dies 16 and integrated circuit 12. The process for fabricating the integrated circuit module 10 will now be described.

Figure 2:
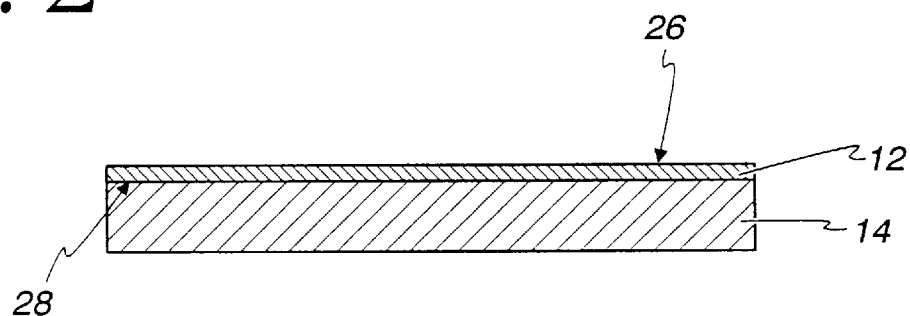
FIG. 2 is a sectional-side view of an integrated circuit formed on a substrate, which may comprise a portion of the integrated circuit module of the present invention.

Referring to FIG. 2, the integrated circuit 12 is provided on the substrate or base 14. The integrated circuit 12 has an active surface 26 remote from the substrate 14. The integrated circuit 12 may include a pattern of integrated components formed physically on the substrate 14, the substrate 14 being made of non-conductive material. Alternatively, the integrated circuit 12 may include a discrete integrated circuit chip having a mounting surface 28 opposite the active surface 26 conventionally attached to the substrate 14. In yet another form, the substrate 14 may be made of a conductive material with the integrated circuit 12 including a first layer made of a dielectric/insulating material disposed between the integrated circuit 12 and substrate 14. The substrate 14 may include any structural material such as, for example, metal, ceramic, plastic, silicon, or any III–V or similar compound.

Figure 3:
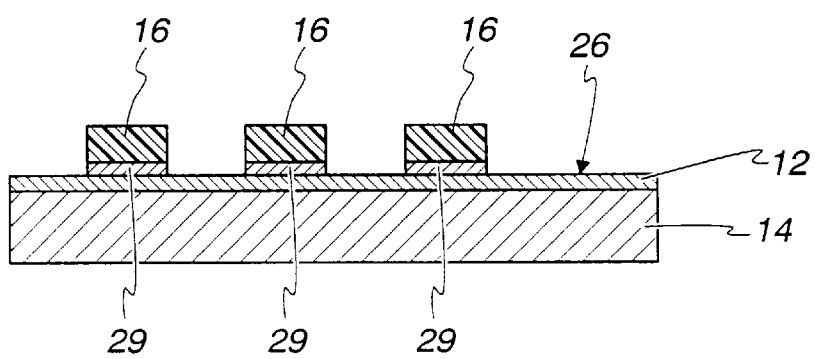
FIG. 3 is a sectional side view similar to that of FIG. 2, further including a plurality of dies attached to the integrated circuit.

As shown in FIG. 3, a plurality of dies 16 are then conventionally attached, via a layer of adhesive 29, to the active surface 26 of the integrated circuit 12. The dies 16 may include any electrical circuit components, including semi-conductor chips such as integrated circuit chips, and other discrete devices, such as, for example, capacitors, resistors, inductors, transducers, etc. Because the dies 16 may be made using different technology than the integrated circuit 12, they must be physically separate components. Adhesively attaching the dies 16 directly to the integrated circuit 12 eliminates the need for separate packaging when interconnection between the circuits is desired.

The adhesive 29 may be conductive or non-conductive depending on circuit requirements. An advantage of using a non-conductive adhesive is that the die 16 may be placed directly over components patterned on the integrated circuit 12. However, if the die 16 includes a hot component, as much thermal impedance as possible in all directions is desired to cool the component. In this instance, it would be desirable to connect the die 16 with a conductive adhesive to a non-patterned area of the integrated circuit 12.

A mold form or dam 30, as shown in FIG. 4, is then placed around the integrated circuit 12 and substrate 14. The dielectric filler material 18 is then added, in liquid form, within the mold form 30 to conformally coat the dies 16 and active surface 26 of integrated circuit 12. The dielectric filler material 18 may generally include any non-conductive material and may be chosen from a variety of families, such as thermosets and thermoplastics, including various encapsulants, such as, Plaskon, epoxies, polyimides, polyesters, Teflons, or any other type of liquid dielectric material suitable for microelectronic purposes.

The dielectric filler material 18 is deposited within the mold form 30 either automatically or manually by conventional liquid puddle or spray coat processes, however, virtually any technique for depositing the dielectric filler material 18 within the mold form 30 may be implemented without departing from the spirit and scope of the present invention. Generally, the conventional liquid puddle dispense would be used based upon the viscosity and solid content of the dielectric filler material 18 being used.

The thickness of the dielectric filler material 18 over the integrated circuit 12 can range from 6 $\mu$m upwards of 5 mils. The thickness may depend on variance of dies 16 and requirements for use with RF applications. After depositing the dielectric filler material 18 in the mold form 30, the dielectric filler material 18 is allowed to cure. After curing, the dielectric filler material 18 has a substantially level top surface 20.

FIG. 5 depicts a slight variation in the step of applying the dielectric filler material 18. As shown in FIG. 5, a mold form 30' is provided which rests on the active surface 26 of the integrated circuit 12 on its outer peripheral edge 32. The dielectric filler material 18 is then deposited in the same manner as previously described with respect to FIG. 4. The mold forms 30 and 30' may be of any non-conductive material, such as plastic, silicon, ceramic, etc., and may be removed after the dielectric filler material 18 has cured. If removed, the composition of the mold forms 30 and 30' becomes essentially irrelevant.

It should be noted that while the mold forms 30 and 30' have been depicted as extending around a single integrated circuit module 10, the substrate 14 may have numerous integrated circuits disposed thereon as shown in FIG. 6. The mold forms 30 and 30' would then extend around the entire substrate 14, with the individual integrated circuit modules 10 being cut-out therefrom.

Figure 7:
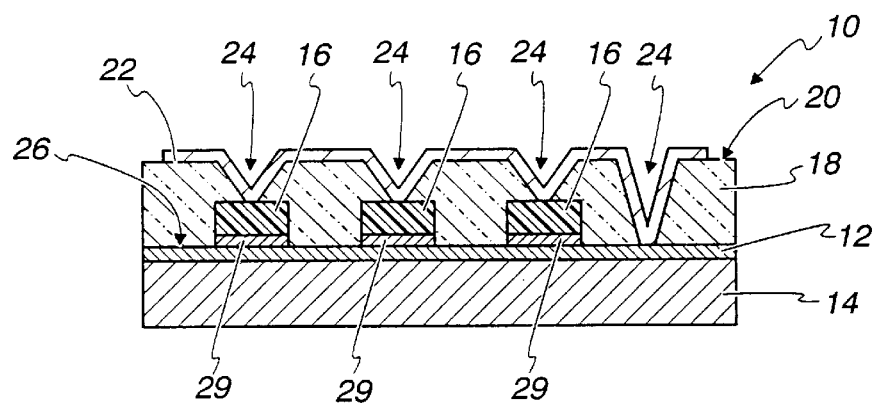
FIG. 7 is a sectional side view similar to that of FIG. 4, further including a pattern of metallization on the top surface of the non-conductive material extending through vias formed therein.

After the dielectric filler material 18 has cured, via openings 24, see FIG. 7, are then conventionally formed in the dielectric filler material 18. The vias 24 extend down to the dies 16 and/or active surface 26 of the integrated circuit 12, and are generally utilized to interconnect selected points on the die 16 to selected points on the integrated circuit 12, or alternatively, selected points on one die 16 to selected points on another die 16. Methods of forming the vias 24 in the dielectric filler material 18 are generally well known in the art and, accordingly, a detailed description thereof is not necessitated.

The etchant used in etching the dielectric material 18 to form the vias 24 can vary from conventional plasmas to lasers to wet chemical etching. For example, the plasmas typically used in etching may include $CF_4/O_2$; the lasers may be YAG, $CO_2$, or argon ion; and the wet chemical etching may use hot NaOH.

The above-mentioned etchants are useful in forming the vias 24 in that they etch the dielectric filler material 18 without etching any 4 layer of the dies 16 or integrated circuit 12. For example, the plasma uses $CF_4/O_2$ which does not etch metallization such as aluminum or gold, which would be the two typical metals exposed through the via 24 formation process. The argon ion laser process is a low energy laser that needs approximately 50x more energy to excite gold or aluminum to an energy state high enough for it to be melted than the dielectric filler material 18. With respect to the YAG or $CO_2$ lasers, there is enough control with pulse time, energy density and frequency not to cause the metal bond pads to ablate.

A layer of metallization is then conventionally deposited on the top surface 20 of the dielectric filler material 18. This layer would also fill the vias 24. The layer of metallization is then etched to form the pattern 22 of electrical conductors or metallization connecting the dies 16 to each other and/or the integrated circuit 12. The pattern of metallization 22 also provides attachment to other circuits or components remote from the integrated circuit module 10. The photolithographic step of patterning and etching the pattern of metallization 22 and the methods of filling the via openings 24 are generally well known in the art and, accordingly, a detailed description thereof is not necessitated.

Figure 8:
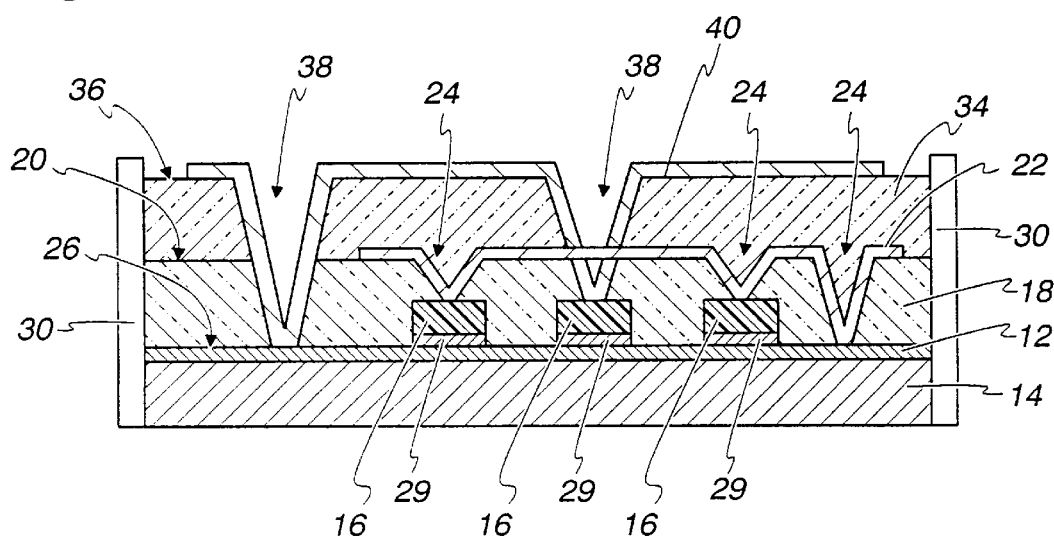
FIG. 8 is a sectional side view similar to that as shown in FIG. 7, further including an additional layer of non-conductive material and an additional pattern of metallization on the top surface thereof extending through vias formed therein.

Referring now to the integrated circuit module shown generally at 10' in FIG. 8, if it is not possible to make all necessary interconnections utilizing one layer of patterned metallization 22, an additional layer of dielectric filler material 34 may be deposited over top of the dielectric layer 18, the pattern of metallization 22 and vias 24 in the same manner as previously described. After the additional layer of dielectric filler 34 has cured to form a substantially level top surface 36, via holes 38 may be conventionally formed in the additional layer of dielectric filler material 34 at predetermined locations utilizing the same methods as previously described.

A second layer of metallization is then conventionally deposited and etched on the top surface 36 of the additional layer of dielectric filler material 34 to form a pattern of electrical conductors or metallization 40, which fills vias 38 and connects the dies 16 to each other and/or the integrated circuit 12. Further, while not shown in FIG. 8, the pattern of metallization 40 may also be connected to specific points on the pattern of metallization 22. The pattern of metallization 40 also provides attachment to other circuits or components remote from the integrated circuit module 10'. The steps of depositing and etching the layer of metallization to form the pattern of metallization 40, and the method of filling vias 38, may be accomplished utilizing the same methods as previously described.

Additional layers of dielectric and patterned metallization may be used as necessary or required for a given circuit design.

While the invention has been described with particular reference to the drawings, it should be understood that various modifications could be made without departing from the spirit and scope of the present invention.

What is claim is:

1. An integrated circuit module comprising:

a substrate;

an integrated circuit on the substrate and defining an active surface remote from the substrate;

a die attached to the active surface of the integrated circuit;

a layer of non-conductive material conformally coating the die and active surface of the integrated circuit, said layer of non-conductive material having a substantially level top surface;

a plurality of vias formed in the layer of non-conductive material selectively aligned with the die and integrated circuit, respectively; and a pattern of metallization on the top surface of the layer of non-conductive material extending through the plurality of vias and selectively interconnecting the die to the integrated circuit.

2. The integrated circuit module of claim 1, further comprising:

a second layer of non-conductive material conformally coating the layer of non-conductive material, the plurality of vias and the pattern of metallization, said second layer of non-conductive material having a substantially level top surface;

a second plurality of vias formed in the second layer of non-conductive material selectively aligned with the die and/or integrated circuit, respectively; and a second pattern of metallization on the top surface of the second layer of non-conductive material extending through the second plurality of vias and selectively interconnecting the die and/or the integrated circuit.

3. The integrated circuit module of claim 1, wherein the layer of non-conductive material comprises a dielectric filler material suitable for microelectronic purposes.

4. The integrated circuit module of claim 3, wherein the dielectric filler material is selected from the group consisting of thermosets, thermoplastics, Plaskon, epoxies, polyimides, polyesters and Teflons.

5. The integrated circuit module of claim 1, wherein the substrate is comprised of a non-conductive material, and wherein the integrated circuit is integrally formed on the substrate.

6. The integrated circuit module of claim 1, wherein the substrate is selected from the group consisting of ceramic, silicon, plastic and metal.

7. The integrated circuit module of claim 1, wherein the die is adhesively attached to the active surface of the integrated circuit with a non-conductive adhesive.

8. The integrated circuit module of claim 1, wherein the die is adhesively attached to the active surface of the integrated circuit at a predetermined location with a conductive adhesive.

9. The integrated circuit module of claim 1, wherein the integrated circuit comprises an integrated circuit chip having an active surface and a mounting surface opposite the active surface, and wherein the mounting surface is adhesively attached to the substrate with a non-conductive adhesive.

10. A method of fabricating an integrated circuit module, said method comprising the steps of:

providing an integrated circuit on a substrate, said integrated circuit having an active surface remote from the substrate;

attaching at least one die to the active surface of the integrated circuit;

conformally coating the at least one die and integrated circuit with a layer of non-conductive material, said layer of non-conductive material having a substantially level top surface;

forming a plurality of vias in the layer of non-conductive material selectively aligned with the at least one die and integrated circuit, respectively; and forming a pattern of metallization on the top surface of the layer of non-conductive material extending through the plurality of vias and selectively interconnecting the at least one die and/or the integrated circuit.

11. The method of claim 10, wherein the step of conformally coating the at least one die and integrated circuit comprises the steps of:

positioning a mold form around the integrated circuit;

adding a liquid non-conductive material within said mold form, said liquid non-conductive material conformally coating the at least one die and integrated circuit; and curing the liquid non-conductive material, wherein the cured non-conductive material has a substantially level top surface.

12. The method of claim 11, further comprising the step of removing the mold form after curing of the liquid non-conductive material.

13. The method of claim 11, wherein the liquid non-conductive material comprises a liquid dielectric filler material suitable for microelectronic purposes.

14. The method of claim 13, wherein the dielectric filler material is selected from the group consisting of thermosets, thermoplastics, Plaskon, epoxies, polyimides, polyesters and Teflons.

15. The method of claim 10, wherein the step of providing a mold form around the integrated circuit comprises the step of providing the mold form around the integrated circuit and substrate.

16. The method of claim 15, further comprising the step of removing the mold form after curing of the liquid non-conductive material.

17. The method of claim 10, wherein the substrate is selected from the group consisting of ceramic, silicon, plastic and metal.

18. The method of claim 10, wherein the at least one die is adhesively attached to the active surface of the integrated circuit with a non-conductive adhesive.

19. The method of claim 10, wherein the at least one die is adhesively attached to the active surface of the integrated circuit at a predetermined location with a conductive adhesive.

20. The method of claim 10, wherein the step of providing an integrated circuit on a substrate comprises the step of integrally forming an integrated circuit on a non-conductive substrate.

21. The method of claim 10, wherein the step of providing an integrated circuit on a substrate comprises the steps of:

providing an integrated circuit chip having an active surface and a mounting surface opposite the active surface; and adhesively attaching the mounting surface of the integrated circuit chip to the substrate with a non-conductive adhesive.

22. The method of claim 10, further comprising the steps of:

conformally coating the layer of non-conductive material, the plurality of vias and the pattern of metallization with a second layer of non-conductive material, said second layer of non-conductive material having a substantially level top surface;

forming a second plurality of vias in the second layer of non-conductive material selectively aligned with the at least one die and/or the integrated circuit, respectively; and forming a second pattern of metallization on the top surface of the second layer of non-conductive material extending through the second plurality of vias and selectively interconnecting the at least one die and/or the integrated circuit.

23. The method of claim 22, wherein the step of conformally coating the layer of non-conductive material, the plurality of vias, and the pattern of metallization, comprises the steps of:

positioning a mold form around the first layer of non-conductive material and first pattern of metallization;

adding a liquid dielectric filler material within said mold form; and curing the liquid dielectric filler material, wherein the cured liquid dielectric filler material has a substantially level top surface.

* * * * *